(12) United States Patent
Kim et al.

(10) Patent No.: US 7,026,240 B2
(45) Date of Patent: Apr. 11, 2006

(54) METHOD OF FABRICATING A SEMICONDUCTOR DEVICE HAVING A PHOTO-SENSITIVE POLYIMIDE LAYER AND A DEVICE FABRICATED IN ACCORDANCE WITH THE METHOD

(75) Inventors: Jae-Hyun Kim, Incheon (KR);
Dong-Won Shin, Seongnam-si (KR);
Boo-Deuk Kim, Suwon-si (KR);
Chang-Ho Lee, Suwon-si (KR);
Won-Mi Kim, Yongin-si (KR);
Seok-Bong Park, Yongin-si (KR)

(73) Assignee: Samsung Electronics, Co., Ltd., (KR)

( * ) Notice: Subject to any disclaimer, the term of this patent is extended or adjusted under 35 U.S.C. 154(b) by 151 days.

(21) Appl. No.: 10/776,064

(22) Filed: Feb. 11, 2004

(65) Prior Publication Data

US 2005/0029631 A1   Feb. 10, 2005

(30) Foreign Application Priority Data

Aug. 7, 2003   (KR) ................. 10-2003-0054762

(51) Int. Cl.
*H01L 21/4763* (2006.01)

(52) U.S. Cl. .............. 438/637; 438/584; 438/597; 438/618; 438/622

(58) Field of Classification Search .............. None
See application file for complete search history.

(56) References Cited

U.S. PATENT DOCUMENTS 5,717,251 A * 2/1998 Hayashi et al.

FOREIGN PATENT DOCUMENTS

JP   2001-094056   4/2001

OTHER PUBLICATIONS

Wolf and Tauber, "Silicon Processing for the VLSI Era, vol. 1—Process Technology," 2000, Lattice Press, vol. 1, p. 527-531.*
Wolf, "Silicon Processing for the VLSI Era, vol. 2—Process Integration," 1990, Lattice Press, vol. 2, p. 273-276.*

* cited by examiner

*Primary Examiner*—Nathan J. Flynn
*Assistant Examiner*—Kevin Quinto
(74) *Attorney, Agent, or Firm*—Mills & Onello, LLP

(57) ABSTRACT

In a semiconductor device fabrication method and in a product formed according to the method, a photosensitive polyimide layer (PSPL) layer is applied to a semiconductor device in a manner which overcomes the limitations of the conventional approaches. The beneficial qualities of an added photoresist layer are utilized to avoid unwanted development of the underlying PSPL layer. In this manner, cracking of the PSPL layer is mitigated or eliminated, reducing the device soft error rate (SER) and increasing device yield. This is accomplished in a reliable and low-cost approach that employs standard device fabrication techniques.

24 Claims, 6 Drawing Sheets

METHOD OF FABRICATING A SEMICONDUCTOR DEVICE HAVING A PHOTO-SENSITIVE POLYIMIDE LAYER AND A DEVICE FABRICATED IN ACCORDANCE WITH THE METHOD

BACKGROUND OF THE INVENTION

Semiconductor devices formed on a substrate, commonly referred to as "chips", are often times encapsulated during the assembly process in order to protect the devices from external environmental influences. For example, during assembly, the chips are commonly coated with an epoxy molding compound (EMC), which serves as a physical barrier for the chip. However, such EMC configurations are known to be a source of mechanical stress that is incident on the chips. For this reason, prior to formation of the EMC, the upper surface of a chip is covered with a polyimide layer during fabrication, which serves to alleviate the mechanical stress.

The polyimide layer further serves to prevent nearby energized particles from entering the chip, which could have an adverse effect on data stored in the chip, or otherwise affect chip operation. For example, the polyimide layer prevents alpha particles from penetrating the chip devices, thereby reducing the soft error rate (SER) of the chip, which otherwise might be increased by entry of the particles into storage capacitors of the chip.

To simplify the process of depositing and placing the polyimide layer, photosensitive polyimide layers (PSPLs) have become popular. Such photosensitive layers have the exposure properties of general photoresist layers, and therefore are readily adaptable to fabrication processes that rely on photolithography for depositing layers of material.

FIGS. 1 and 2 are cross-sectional views of a conventional fabrication method of a semiconductor device utilizing a PSPL. In the figures, M represents an internal circuit region of a device, and P represents a bonding pad region of a device.

In FIG. 1, an inter-layer dielectric (ILD) layer 13 is formed on a semiconductor substrate 11. A bonding pad 15 is formed on the ILD 13 in the pad region P. A passivation layer 17 is formed on the resultant structure, in both the circuit region M and in the pad region P. The passivation layer 17 comprises, for example, a single layer of silicon nitride or a combined silicon nitride and silicon oxide layer. Following this, a PSPL layer 19 is formed on the passivation layer 17, for example to a depth on the order of 68,000 Å.

In FIG. 2, the resulting structure is selectively exposed to light using a photo mask to form a vertical opening over the bonding pad 15. As a result, a region 19n of the PSPL 19 above the bonding pad 15 is properly exposed. However, during exposure, a portion of the light can stray to improperly irradiate other regions of the PSPL, leading to unwanted exposure regions 19a in other locations of the structure. This is caused, for example, by internal reflection and/or diffraction of the light within the exposure apparatus, such as a stepper apparatus, containing the photo mask. The resulting structure is then developed, using a developing step, to remove the properly exposed region 19n of the PSPL; however, the improperly exposed region 19a is also developed and removed during this step.

Following this, the passivation layer 17 is etched using the developed PSPL layer 19 as an etch mask, exposing the underlying bonding pad 15. The exposed bonding pad 15 is then electrically connected to a package pin, for example, using a wire bonding technique.

The improperly exposed region 19a' corresponds to a barcode pattern, or mask alignment key pattern of the photo mask. This is referred to in the art as a "ghost image". The thickness of improperly exposed region 19a can be on the order of 1000 Å, or deeper. As a result, the PSPL layer 19 has an uneven thickness in the improperly exposed region 19a. With the continuing trend toward ever-higher integration of semiconductors, there is a need for thinner PSPL layers 19, for example, on the order of 30,000 Å. However, as the PSPL layer becomes thinner, the depth of the ghost image 19a becomes more and more significant, leading to proportionally greater thickness variation in the PSPL layer 19. This results in a higher likelihood of cracking in the PSPL layer, which corresponds directly with an increase in the device soft error rate (SER).

During exposure of the PSPL, any refracted or reflected light that is a source of the ghost images 19a has a lower energy than the direct light that properly exposes the region 19n above the bonding pad 15. Nevertheless, the refracted or reflected light still has an energy level that is high enough to expose the ghost image regions 19a in the PSPL. This is because the PSPL layer 19 has relatively poor photosensitivity as compared to conventional photoresist. This comparison is depicted in FIG. 3.

FIG. 3 is a plot of development rate R as a function of exposure energy level E. Curve 1 represents exposure characteristics of the conventional photoresist material, and curve 2 represents exposure characteristics of the PSPL layer 19. As can be seen in the plot, the PSPL (curve 2) exhibits a faster development rate than the conventional photoresist (curve 1) at energy levels below the critical energy Ec level, which is the level of exposure energy required for normal exposure of the layer. At levels less than Ec, generated for example, by reflected energy, a PSPL layer is exposed more rapidly than conventional photoresist materials, and is therefore more sensitive to stray exposure energy, for example, reflected and diffracted exposure energy.

Japanese laid-open patent number 2001-94056 discloses a method of fabricating a semiconductor device using a PSPL. In this approach, a passivation layer is formed on an underlying substrate that includes a bonding pad. A PSPL layer is formed on the passivation layer, and a photoresist layer, approximately 5000 Å in thickness, is sequentially formed on the PSPL layer. An exposure process is performed to expose regions of the photoresist layer and the PSPL layer above the bonding pad. The exposed regions of the photoresist layer and the PSPL layer are developed to form a via hole that exposes the passivation layer above the bonding pad. The passivation layer above the bonding pad is then etched using the photoresist layer as an etching mask, exposing the bonding pad. Following this, the upper photoresist pattern is removed, and the bonding pad is wire-bonded to a package pin.

In this example, due to the thickness of the photoresist layer, the exposure time increases proportionally, and therefore the energy for exposing the photoresist layer and the PSPL layer is considerably higher than that required for conventional photolithography processes. Lengthening of exposure time and increase in the exposure energy can cause a degradation of process throughput and increase the likelihood of pad open failure in the subsequent etching process. In addition, since the photoresist pattern is removed only after exposing the underlying bonding pad, it is difficult to remove the relatively thick photoresist pattern without causing damage to the underlying PSPL and the exposed pad during the removal process.

SUMMARY OF THE INVENTION

The present invention is directed to a method and product formed in accordance with the method in which a PSPL layer is used in the fabrication of a semiconductor device in a manner which overcomes the limitations of the conventional approaches. The beneficial qualities of an added photoresist layer are utilized to avoid unwanted development of the underlying PSPL layer. In this manner, cracking of the PSPL layer is mitigated or eliminated, reducing the device soft error rate (SER) and increasing device yield. This is accomplished in a reliable and low-cost approach that employs standard device fabrication techniques.

In a first aspect, the present invention is directed to a method of fabricating a semiconductor device. A passivation layer is provided on a circuit element of the semiconductor device. The passivation layer is patterned to expose an upper surface of the circuit element. A photosensitive layer is provided on the passivation layer and the circuit element. A photoresist layer is provided on the photosensitive layer. A region of the photoresist layer and a region the photosensitive layer are exposed above the circuit element. The photoresist layer and the exposed region of the photosensitive layer are then removed.

In one embodiment, the passivation layer comprises a stacked CVD oxide layer and CVD nitride layer. The patterning of the passivation layer comprises, for example, selectively etching the passivation layer to expose the circuit element.

In another embodiment, a dielectric layer is provided on the semiconductor substrate; and the circuit element is provided on the dielectric layer. The circuit element may comprise a conductive element, for example, a bonding pad, a fuse, a scribe lane, a metal layer, or a device terminal.

The photosensitive layer may comprise, for example, a polyimide layer, a novolak layer, or a resol layer.

The photoresist layer is preferably of a thickness that is sufficient to prevent the underlying photo-sensitive layer from becoming exposed during the exposing step, and yet is thin enough so as to be fully removed during the removing step. In one example, the photoresist layer is of a thickness less than or equal to about 500 Å.

The photoresist layer and the exposed region of the photosensitive layer may be removed, for example, by a developer, for example tetra-methyl-ammonium-hydroxide (TMAH). The photoresist layer and the exposed region of the photosensitive layer are removed at the same time by the developer.

The photoresist layer protects regions of the photosensitive layer, other than the region above the circuit element, from exposure during the exposing step.

In another aspect, the present invention is directed to a semiconductor device prepared in accordance with the above-described methods.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

In the following description of preferred embodiments of the present invention and in the claims that follow, the term "on", when referring to layers of material used in the fabrication of the semiconductor devices, refers to a layer that is directly applied to an underlying layer, or refers to a layer that is above an underlying layer with an optional intermediate layer or layers therebetween.

FIGS. 4–7 are cross-sectional views of a fabrication method for forming a semiconductor device utilizing a PSPL, in accordance with the present invention. As in the above figures, M represents an internal circuit region of a device, and P represents a bonding pad region of a device. Although the present invention is described in conjunction with using a PSPL layer to form a via hole for exposing a bonding pad region, the present invention applies equally well to using a PSPL layer in other fabrication processes, as well as use of a PSPL layer in conjunction with other components of a semiconductor device. Such components may include, for example other conductive elements, such as fuses and scribe lanes; active elements such as transistors; passive elements; and the like.

Figure 1:
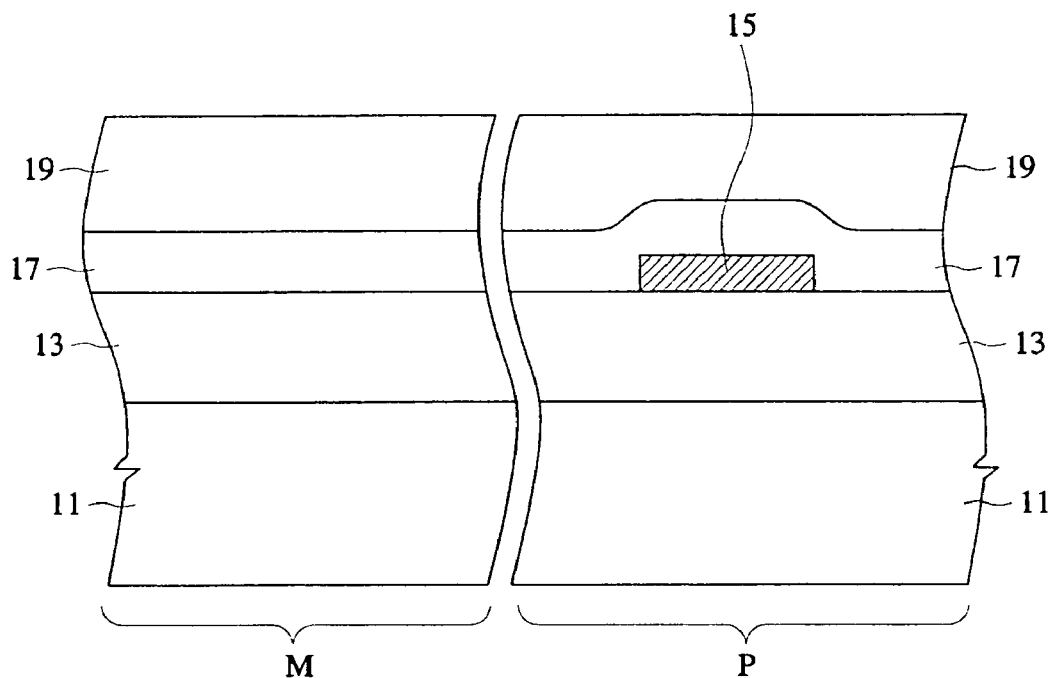
FIGS. 1 and 2 are cross-sectional views of a conventional fabrication method of a semiconductor device utilizing a PSPL.
Figure 2:
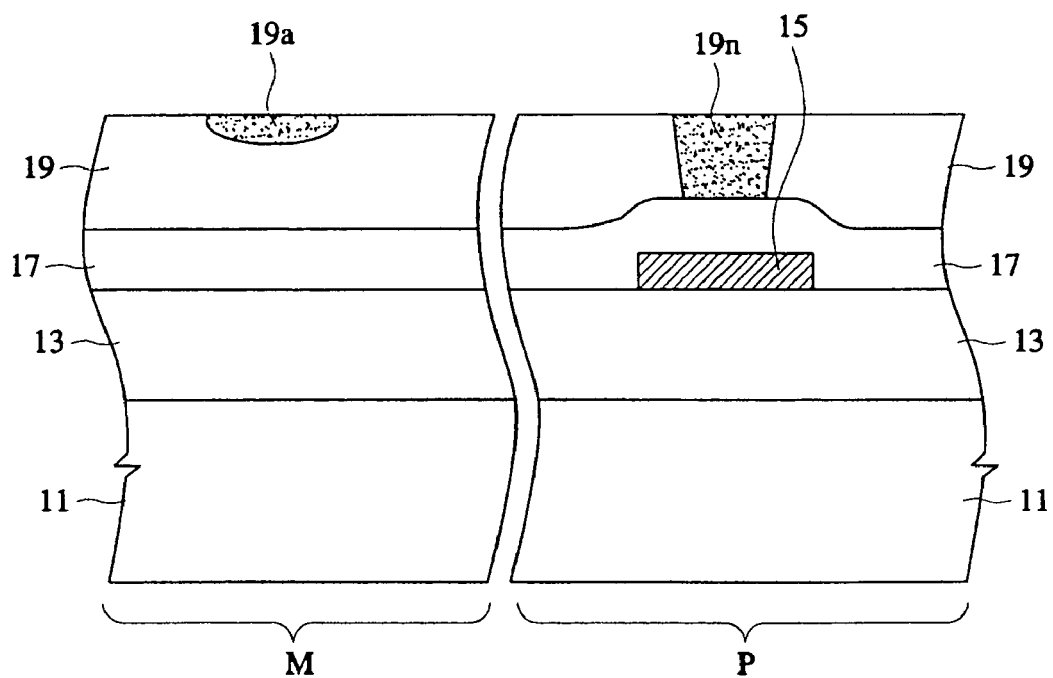
Figure 3:
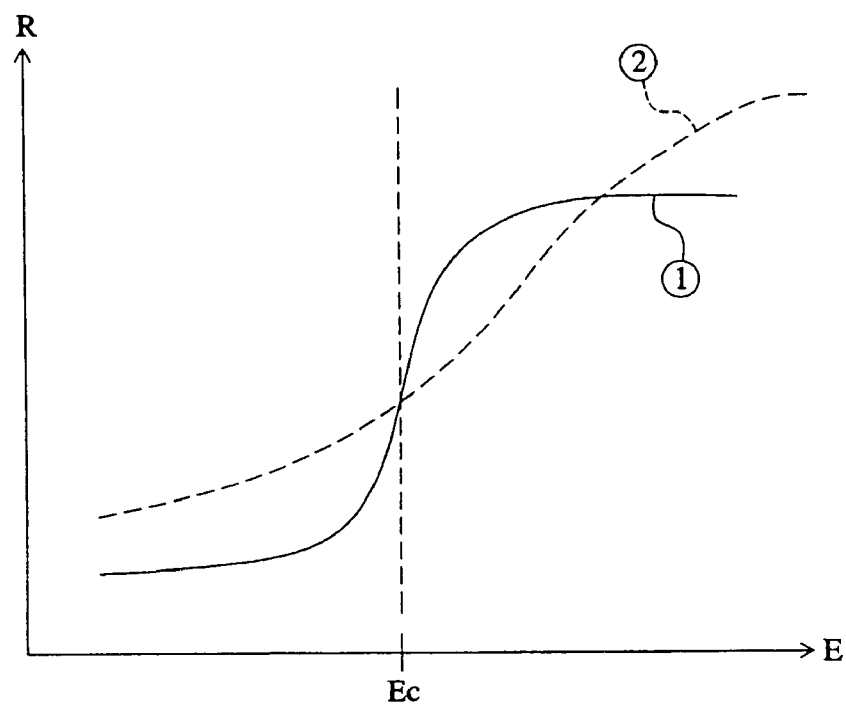
FIG. 3 is a plot of development rate R as a function of exposure energy level E, comparing the exposure characteristics of a conventional photoresist material with exposure characteristics of a PSPL layer.
Figure 4:
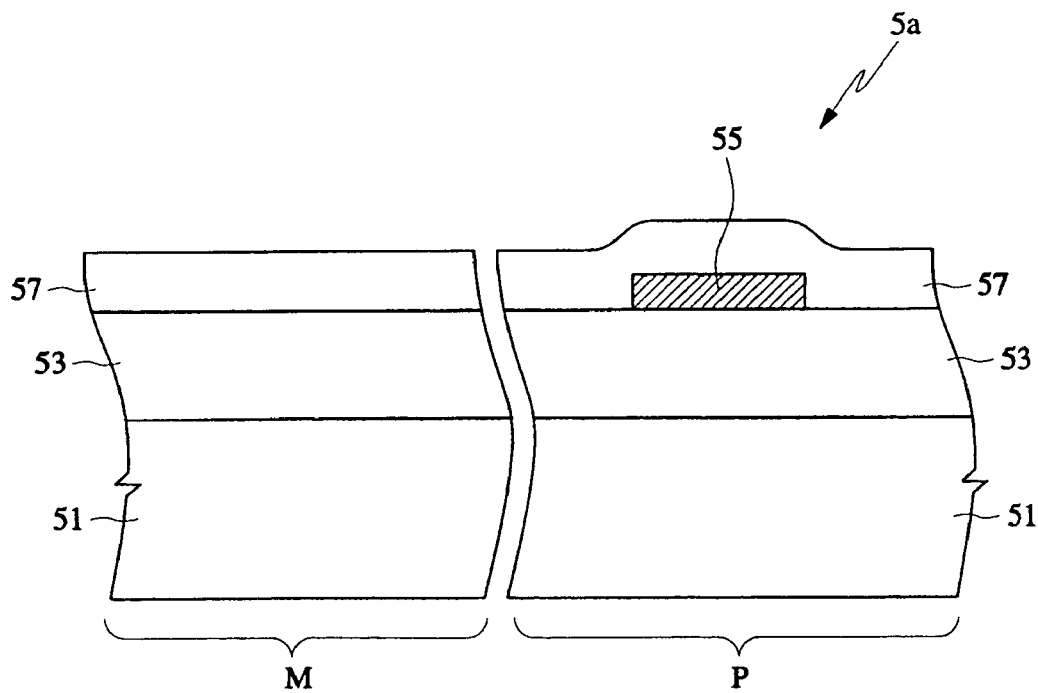
FIGS. 4–7 are cross-sectional views of a fabrication method for forming a semiconductor device utilizing a PSPL, in accordance with the present invention.

With reference to FIG. 4, an inter-layer dielectric (ILD) layer 53 is formed on a semiconductor substrate 51. A bonding pad 55 is formed on the ILD 53 in the pad region P by patterning a conductive layer. A passivation layer 57 is formed on the resultant structure, in both the circuit region M and in the pad region P. The passivation layer 57 may be formed, for example, by stacking a CVD-deposited oxide layer, followed by a CVD-deposited nitride layer.

Figure 5:
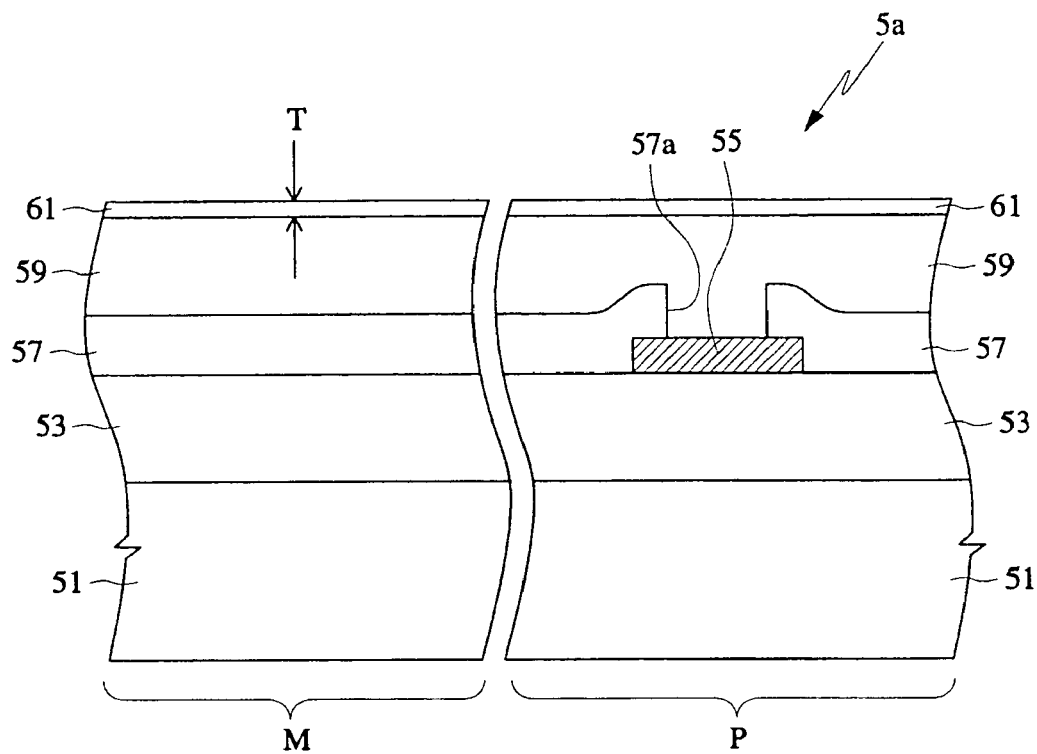

With reference to FIG. 5, an opening 57a is formed by patterning the passivation layer 57 using a conventional photolithography etching process. Following this, a PSPL layer 59 is formed on the resulting structure, including the exposed opening 57a. The PSPL layer 59 fills the opening 57a and covers the patterned passivation layer 57, for example to a depth on the order of 30,000 Å, and preferably in the range of 10,000–70,000 Å. The PSPL layer comprises, for example polyimide, novolak or resol material. A photoresist layer 61 is then provided on the PSPL layer 59.

In one example, the PSPL 59 and the photoresist layer 61 materials are positive-type materials. Alternatively, either, or both, may be negative-type materials. Preferably, the PSPL 59 and photoresist layer 61 are the same type (positive-type or negative-type), so that a single photolithography step can be used to expose both layers simultaneously, improving productivity. The photoresist layer 61 is formed, for example, by applying a liquid photoresist coating, followed by a pre-exposure bake of the coating. The photoresist coating is preferably formed of a liquid that is compatible with, i.e. does not dissolve, the underlying PSPL layer 59.

It is further desirable that the photoresist layer 61 is of a sufficient thickness T to prevent any light reflected or diffracted in the stepper during the exposure process from entering the underlying PSPL layer 59. At the same time, the photoresist layer 61 should be thin enough such that it is capable of being wholly removed during the subsequent developing process, for example, a developing process that uses tetra methyl ammonium hydroxide (TMAH) to develop the exposed regions, as discussed below. In one example, the photoresist layer 61 is less than or equal to about 500 Å in thickness T.

Figure 6:
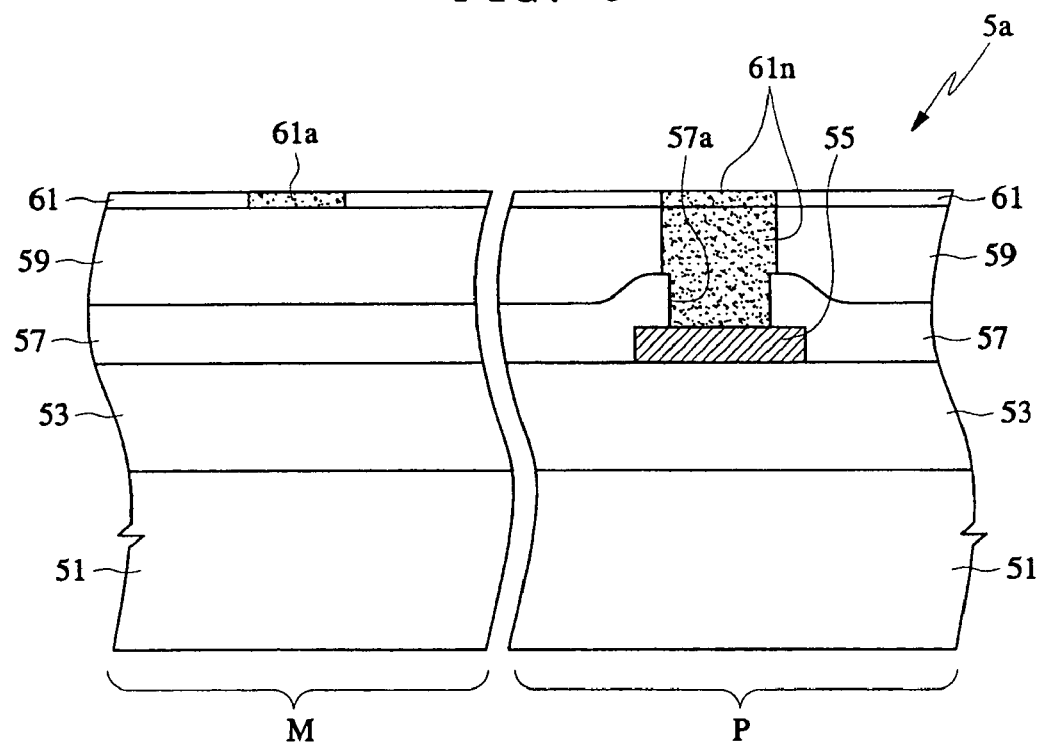
Figure 8:
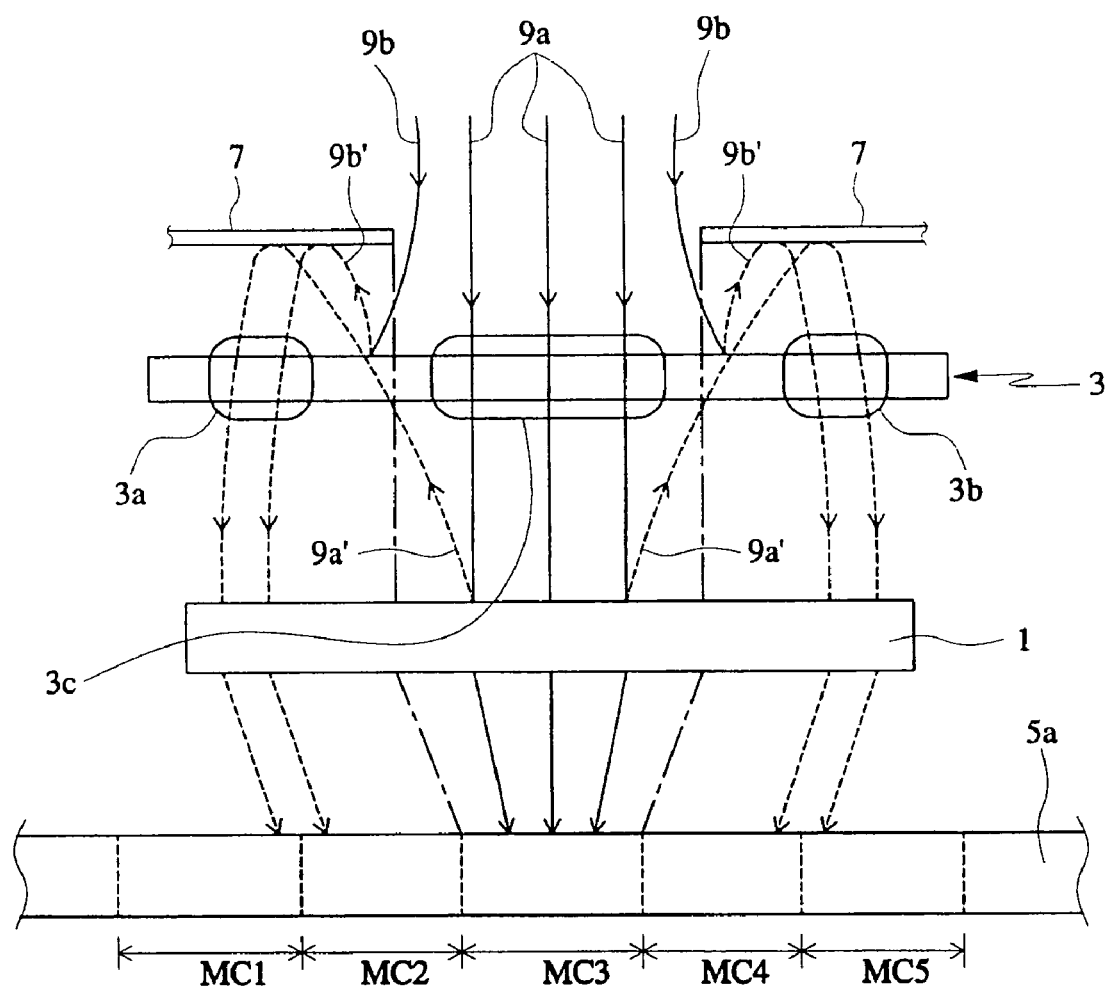
FIG. 8 is a cross-sectional view of a stepper configured to perform the step of exposing photosensitive regions of the substrate, in accordance with the present invention.

As shown in FIGS. 6 and 8, the substrate 5a, including the photoresist layer 61, is loaded into an exposing apparatus, for example a stepper. With reference to FIG. 8, a typical stepper includes a lens unit 1, a photo mask 3, and a blade 7. The lens unit 1 functions to focus the incident light to a predetermined region of the substrate. The photo mask 3 includes at least one integrated circuit region 3c, for example, formed at its center. The photo mask 3 further comprises, for example, a bar code region 3a and a mask alignment key region 3b. The bar code region 3a comprises, for example, a bar code pattern, corresponding to identification information of the photo mask 3 used for recognition, while the mask alignment key region 3b comprises an alignment key pattern used for alignment of the photo mask 3 relative to the substrate 5a. Following alignment of the photo mask 3, the width of the opening of the blade 7 is adjusted to allow for light energy 9a, 9b emitted by a light source (not shown) to pass through the integrated circuit region 9a of the photo mask. In one example, the light energy 9a, 9b may be at the wavelength of g light, i light, KrF laser light, or ArF laser light. In the case of i light, the photoresist may have a thickness of about 300 Å.

A large amount of a first portion 9a of the light energy passing through the center of the opening of the blade 7 passes through the integrated circuit region 3c of the photo mask 3 and the lens unit 1. This first light energy 9a irradiates the pad region P in the selected main chip region MC3 of the substrate. Specifically, the first light energy 9a exposes the PSPL 59 and the photoresist layer 61 above the pad 55 in desired sections of the selected main chip region MC3. As a result, normal exposure regions 61n are formed in the PSPL 59 and the photoresist layer 61 above the pad 55.

However, a small portion 9a' of the first light energy 9a may be reflected from the surface of the lens unit 1. The reflected light 9a' passes back through the photo mask 3, and reflects off the undersurface of the blade 7, and subsequently, through the bar code region 3a and/or alignment key region 3b of the photo mask 3. In this case, the reflected light 9a' may irradiate non-selected main chip regions MC1, MC2, MC4, MC5 of the substrate 5 adjacent the selected main chip region MC3.

As a result, as depicted in FIG. 6, the reflected light 9a' may irradiate other portions of the substrate, for example the internal circuit region M of the substrate, where exposure is not desired. However, according to the present invention, owing to the presence of the photoresist layer, the reflected light 9a' incident on the photoresist layer does not expose the underlying PSPL layer 59, since the photoresist layer 61 is of sufficient thickness to protect the underlying PSPL layer 59. The resulting improperly exposed region 61a is thus essentially limited to the protective photoresist layer 61, and is of a depth that is less than the thickness of the photoresist layer 61. In this manner, the photoresist layer 61 prevents the underlying PSPL layer 59 from unwanted exposure due to the reflected light 9a'.

In addition, a second portion 9b of the light energy may be diffracted about the opening of the blade 7, reflected off the photo mask 9b' toward the under surface of the blade 7, and subsequently may be reflected through the bar code region 3a and/or alignment key region 3b of the photo mask. Again, in this case, the diffracted and reflected second light 9b' may irradiate non-selected main chip regions MC1, MC2, MC4, MC5 adjacent the selected main chip region MC3.

As a result, as depicted in FIG. 6, the first light portion 9a' or second light portion 9b' may improperly irradiate a portion 61a of the internal circuit region M of the substrate. However, according to the present invention, owing to the presence of the photoresist layer, the reflected or refracted light 9a', 9b' incident on the photoresist layer does not expose the underlying PSPL layer 59, since the photoresist layer 61 is of sufficient thickness to protect the underlying PSPL layer 59. The resulting improperly exposed region 61a is thus essentially limited to the protective photoresist layer 61, and is of a depth that is less than the thickness T of the photoresist layer 61. In this manner, the photoresist layer 61 prevents the underlying PSPL layer 59 from unwanted exposure due to the refracted and reflected light 9a', 9b'.

Figure 7:
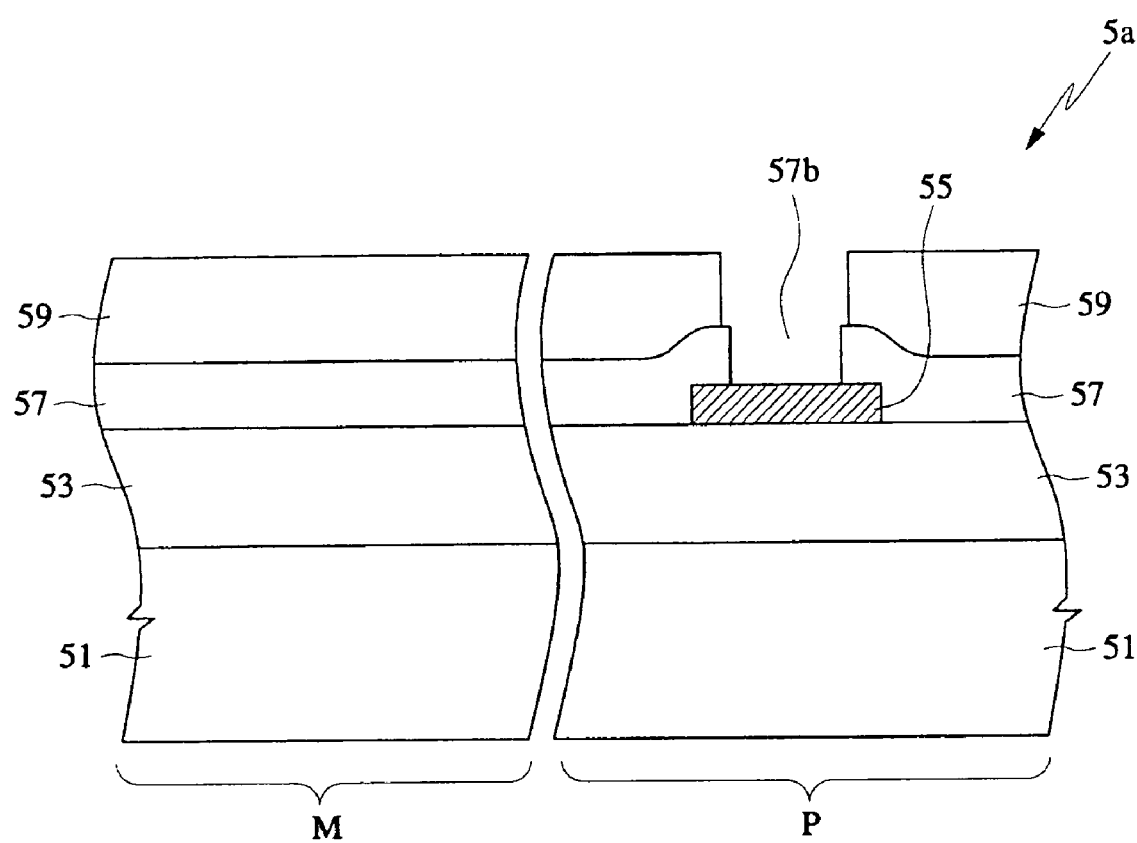

With reference to FIG. 7, the photoresist layer 61 and the properly exposed portion 61n of the PSPL 59 are removed, for example, by developing the resultant structure using a developer such as TMAH. In this manner, a bonding pad window 57b exposing the underlying bonding pad 55 is formed.

During the developing process, any non-exposed photo resist layer 61 is removed along with the improperly exposed region 61a. This is because even though the entire photoresist layer 61 is not exposed, the photoresist layer, having a thickness of about 300–500 Å, is sufficiently thin to be entirely dissolved by the developer, even though it has not been exposed. Therefore, for example in the case where the photoresist layer 61 is formed to a thickness of about 500 Å, or less, the photoresist layer 61 is entirely removed during the development process. Following this, the PSPL layer 59 is hardened using a conventional post-exposure baking process.

Figure 9A:
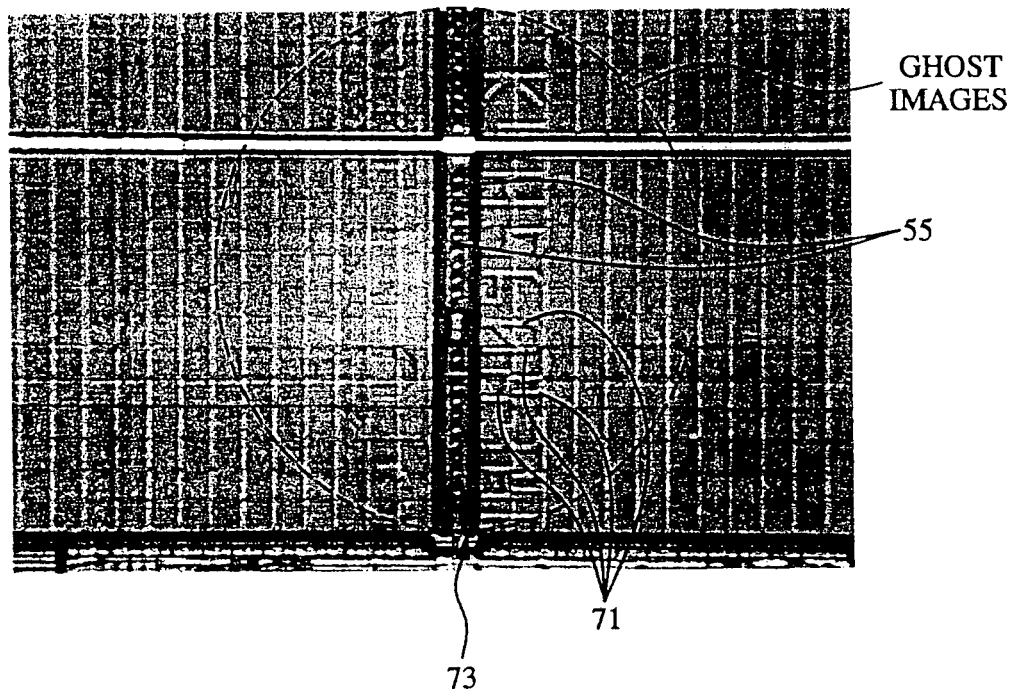
FIGS. 9A and 9B are comparative illustrations of top views of semiconductor devices prepared according to the conventional approaches and prepared in accordance with the present invention, respectively, illustrating the presence and substantial elimination of ghost images that appear in regions surrounding a scribe lane.
Figure 9B:
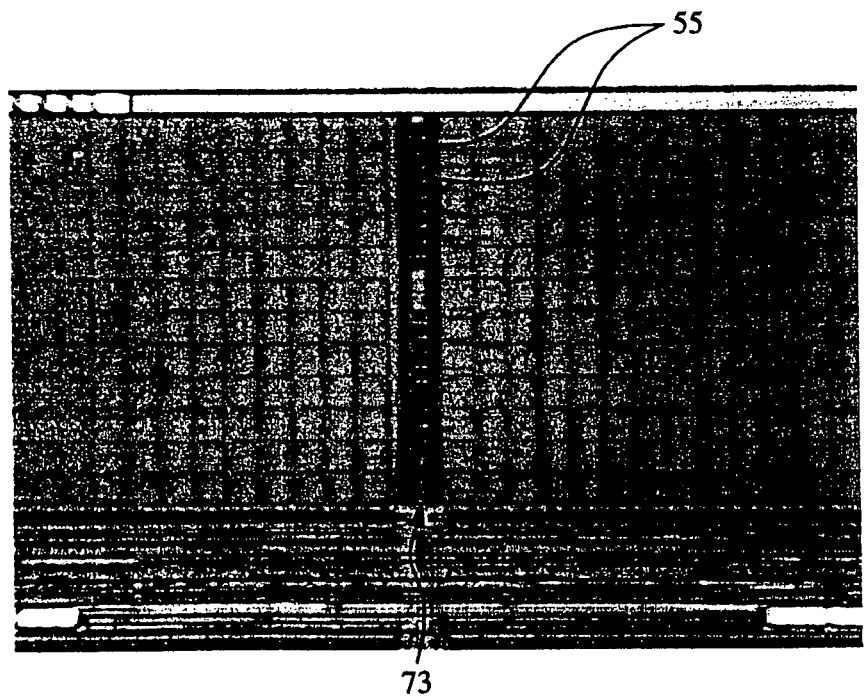

Semiconductor devices prepare in accordance with the method of the present invention have been found to exhibit superior performance characteristics as compared to those prepared in accordance with conventional approaches. For example, a significant reduction in ghost images surrounding a scribe lane of a semiconductor device has been exhibited through fabrication using the method of the present invention. A comparative illustration is provided FIGS. 9A and 9B. FIG. 9A is an top view of a scribe lane 73 of a semiconductor device prepared in accordance with a conventional approach. This view shows a plurality of ghost images 71 on either side of the scribe lane 73 including bonding pads 55. FIG. 9B is an top view of a scribe lane 73 of a semiconductor device prepared in accordance with the method of the present invention. In this view, it can be seen that the regions surrounding the scribe lane 73 and bonding pads 55 are substantially void of ghost images.

While this invention has been particularly shown and described with references to preferred embodiments thereof, it will be understood by those skilled in the art that various changes in form and details may be made herein without departing from the spirit and scope of the invention as defined by the appended claims.

We claim:

1. A method of fabricating a semiconductor device comprising:
   providing a passivation layer on a circuit element of the semiconductor device;
   patterning the passivation layer to expose an upper surface of the circuit element;
   providing a photosensitive layer on the passivation layer and the circuit element;
   providing a photoresist layer on the photosensitive layer, wherein the photoresist layer is of a thickness that is sufficient to prevent the underlying photo-sensitive layer from becoming exposed during the exposing step, and is of a thickness so as to be fully removed during the removing step;
   exposing a region of the photoresist layer and the photosensitive layer above the circuit element; and
   removing the photoresist layer and the exposed region of the photosensitive layer.

2. The method of claim 1 wherein providing the passivation layer comprises a stacked CVD oxide layer and CVD nitride layer.

3. The method of claim 1 wherein patterning the passivation layer comprises selectively etching the passivation layer to expose the circuit element.

4. The method of claim 1 further comprising:
   providing a dielectric layer on a semiconductor substrate; and
   providing the circuit element on the dielectric layer.

5. The method of claim 1 wherein the photosensitive layer comprises one of: a polyimide layer, a novolak layer, and a resol layer.

6. The method of claim 1 wherein the photoresist layer is of a thickness less than or equal to about 500 Å.

7. The method of claim 1 wherein the photoresist layer protects regions of the photosensitive layer, other than the region above the circuit element, from exposure during the exposing step.

8. The method of claim 1 wherein the circuit element comprises a conductive element.

9. The method of claim 8 wherein the conductive element comprises an element selected from the group consisting of: a bonding pad, a fuse, a scribe lane, a metal layer, and a device terminal.

10. The method of claim 1 wherein removing the photoresist layer and the exposed region of the photosensitive layer comprises developing the photoresist layer and the exposed region with a developer.

11. The method of claim 10 wherein the developer comprises tetra-methyl-ammonium-hydroxide (TMAH).

12. The method of claim 11 wherein the developer removes the photoresist layer and the exposed region of the photosensitive layer contemporaneously.

13. A semiconductor device prepared in accordance with the steps of:
   providing a passivation layer on a circuit element of a semiconductor device;
   patterning the passivation layer to expose an upper surface of the circuit element;
   providing a photosensitive layer on the passivation layer and the circuit element;
   providing a photoresist layer on the photosensitive layer, wherein the photoresist layer is of a thickness that is sufficient to prevent the underlying photo-sensitive layer from becoming exposed during the exposing step, and is of a thickness so as to be fully removed during the removing step;
   exposing a region of the photoresist layer and the photosensitive layer above the circuit element; and
   removing the photoresist layer and the exposed region of the photosensitive layer.

14. The semiconductor device of claim 13 wherein providing the passivation layer comprises a stacked CVD oxide layer and CVD nitride layer.

15. The semiconductor device of claim 13 wherein patterning the passivation layer comprises selectively etching the passivation layer to expose the circuit element.

16. The semiconductor device of claim 13 further comprising:
   providing a dielectric layer on a semiconductor substrate; and
   providing the circuit element on the dielectric layer.

17. The semiconductor device of claim 13 wherein the photosensitive layer comprises one of: a polyimide layer, a novolak layer, and a resol layer.

18. The semiconductor device of claim 13 wherein the photoresist layer is of a thickness less than or equal to about 500 Å.

19. The semiconductor device of claim 13 wherein the photoresist layer protects regions of the photosensitive layer, other than the region above the circuit element, from exposure during the exposing step.

20. The semiconductor device of claim 13 wherein the circuit element comprises a conductive element.

21. The semiconductor device of claim 20 wherein the conductive element comprises an element selected from the group consisting of: a bonding pad, a fuse, a scribe lane, a metal layer, and a device terminal.

22. The semiconductor device of claim 13 wherein removing the photoresist layer and the exposed region of the photosensitive layer comprises developing the photoresist layer and the exposed region with a developer.

23. The semiconductor device of claim 22 wherein the developer comprises tetra-methyl-ammonium-hydroxide (TMAH).

24. The semiconductor device of claim 23 wherein the developer removes the photoresist layer and the exposed region of the photosensitive layer contemporaneously.

* * * * *